(12) United States Patent
Noichi et al.

(10) Patent No.: US 8,759,867 B2
(45) Date of Patent: Jun. 24, 2014

(54) SEMICONDUCTOR LIGHT EMITTING DEVICE

(75) Inventors: Takuya Noichi, Kaifu-gun (JP); Yuichi Okada, Tokushima (JP); Takahito Miki, Itano-gun (JP)

(73) Assignee: Nichia Corporation, Anan-shi (JP)

( * ) Notice: Subject to any disclaimer, the term of this patent is extended or adjusted under 35 U.S.C. 154(b) by 77 days.

(21) Appl. No.: 13/148,087

(22) PCT Filed: Oct. 14, 2009

(86) PCT No.: PCT/JP2009/067766
§ 371 (c)(1),
(2), (4) Date: Aug. 5, 2011

(87) PCT Pub. No.: WO2010/092707
PCT Pub. Date: Aug. 19, 2010

(65) Prior Publication Data
US 2011/0291154 A1 Dec. 1, 2011

(30) Foreign Application Priority Data

Feb. 10, 2009 (JP) ................................. 2009-028687

(51) Int. Cl.
*H01L 33/38* (2010.01)
*H01L 33/54* (2010.01)
*H01L 33/64* (2010.01)

(52) U.S. Cl.
USPC ................ 257/99; 257/95; 257/100; 257/173

(58) Field of Classification Search
None
See application file for complete search history.

(56) References Cited

U.S. PATENT DOCUMENTS

| 6,661,032 | B2 * | 12/2003 | Meng et al. | 257/99 |
| 7,183,588 | B2 * | 2/2007 | Chia et al. | 257/99 |
| 7,692,259 | B2 | 4/2010 | Suehiro | |
| 2002/0063329 | A1 * | 5/2002 | Horie et al. | 257/706 |
| 2007/0058059 | A1 * | 3/2007 | Suehiro | 348/294 |

(Continued)

FOREIGN PATENT DOCUMENTS

| JP | 2004-119631 A | 4/2004 |
| JP | 2004-207655 A | 7/2004 |

(Continued)

*Primary Examiner* — Johannes P Mondt
(74) *Attorney, Agent, or Firm* — Global IP Counselors, LLP

(57) ABSTRACT

A semiconductor light emitting device, has a package constituted by the lamination of a first insulating layer having a pair of positive and negative conductive wires formed on its upper face, an inner-layer wire below the first insulating layer, and a second insulating layer below the inner-layer wire; a semiconductor light emitting element that has a pair of positive and negative electrodes on the same face side and that is disposed with these electrodes opposite the conductive wires; and a sealing member that covers the semiconductor light emitting element, wherein part of the conductive wires is formed extending in the outer edge direction of the sealing member from directly beneath the semiconductor light emitting element, on the upper face of the first insulating layer, and is connected to the inner-layer wire via a conductive wire disposed in the thickness direction of the package, and the inner-layer wire is disposed so as to be spaced apart from the outer periphery of the semiconductor light emitting element in a see-through view of the package from the upper face side of the first insulating layer.

23 Claims, 15 Drawing Sheets

(56) References Cited

U.S. PATENT DOCUMENTS

| | | | |
|---|---|---|---|
| 2008/0029780 A1 | 2/2008 | Ohtsuka et al. | |
| 2008/0043444 A1 | 2/2008 | Hasegawa et al. | |
| 2008/0083931 A1* | 4/2008 | Bando et al. | 257/99 |
| 2008/0122123 A1* | 5/2008 | Pang | 257/788 |
| 2008/0237624 A1* | 10/2008 | Kang et al. | 257/99 |
| 2009/0200570 A1 | 8/2009 | Mori et al. | |
| 2011/0169037 A1 | 7/2011 | Hasegawa et al. | |

FOREIGN PATENT DOCUMENTS

| | | |
|---|---|---|
| JP | 2004-266168 A | 9/2004 |
| JP | 2006-093565 A | 4/2006 |
| JP | 2007-103917 A | 4/2007 |
| JP | 2008-288543 A | 11/2008 |
| TW | 200541415 A | 12/2005 |
| WO | WO 2006/046655 A1 | 5/2006 |

* cited by examiner

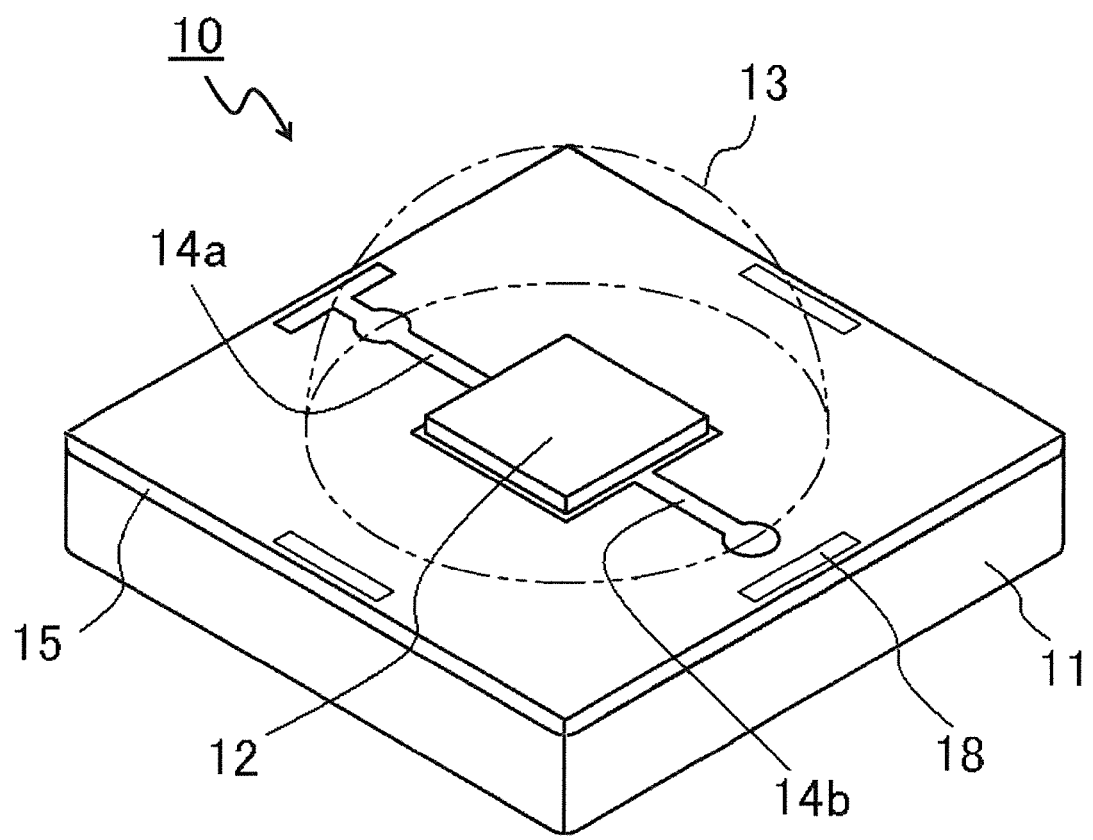
F I G. 2

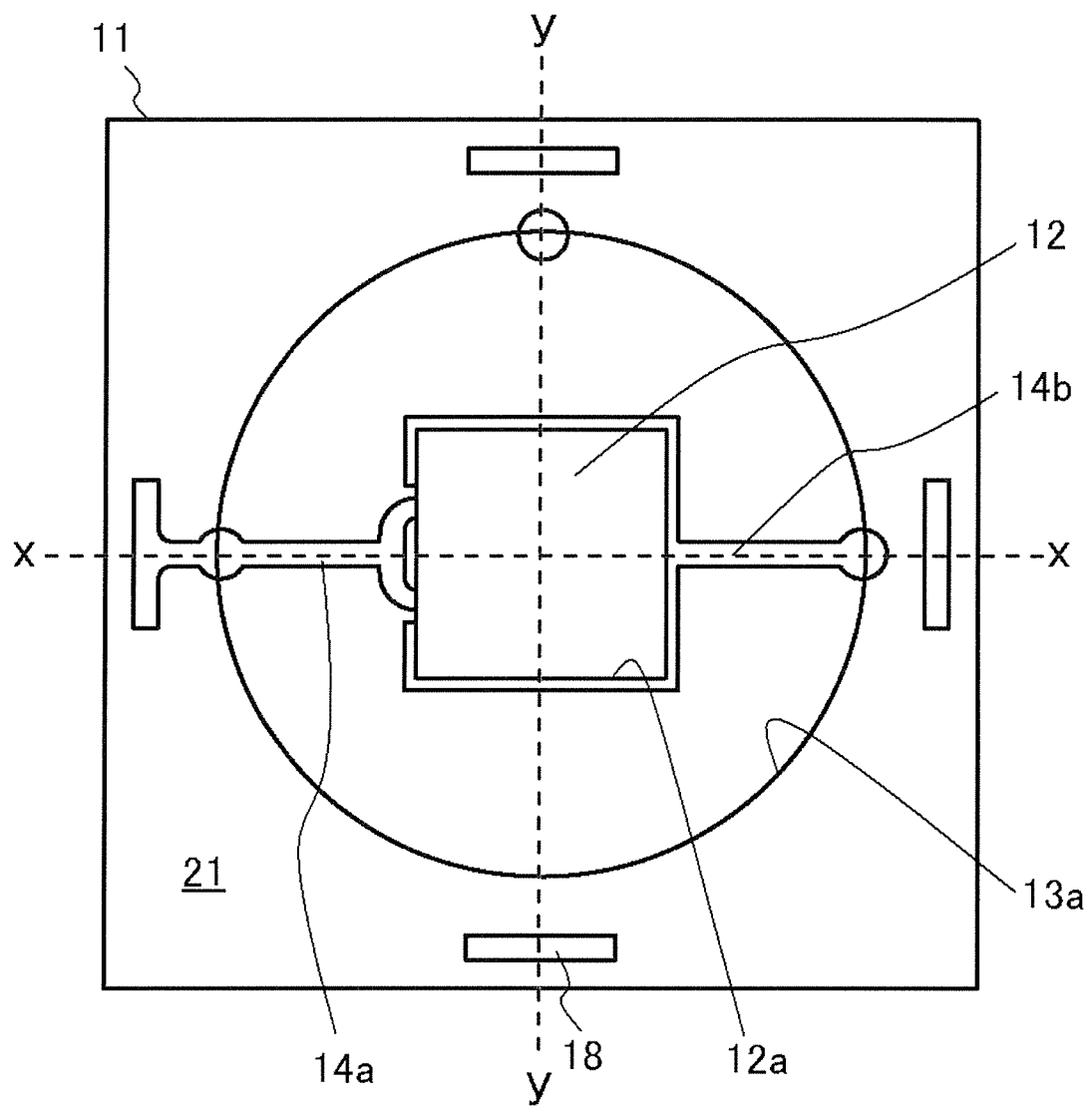
F I G. 3A

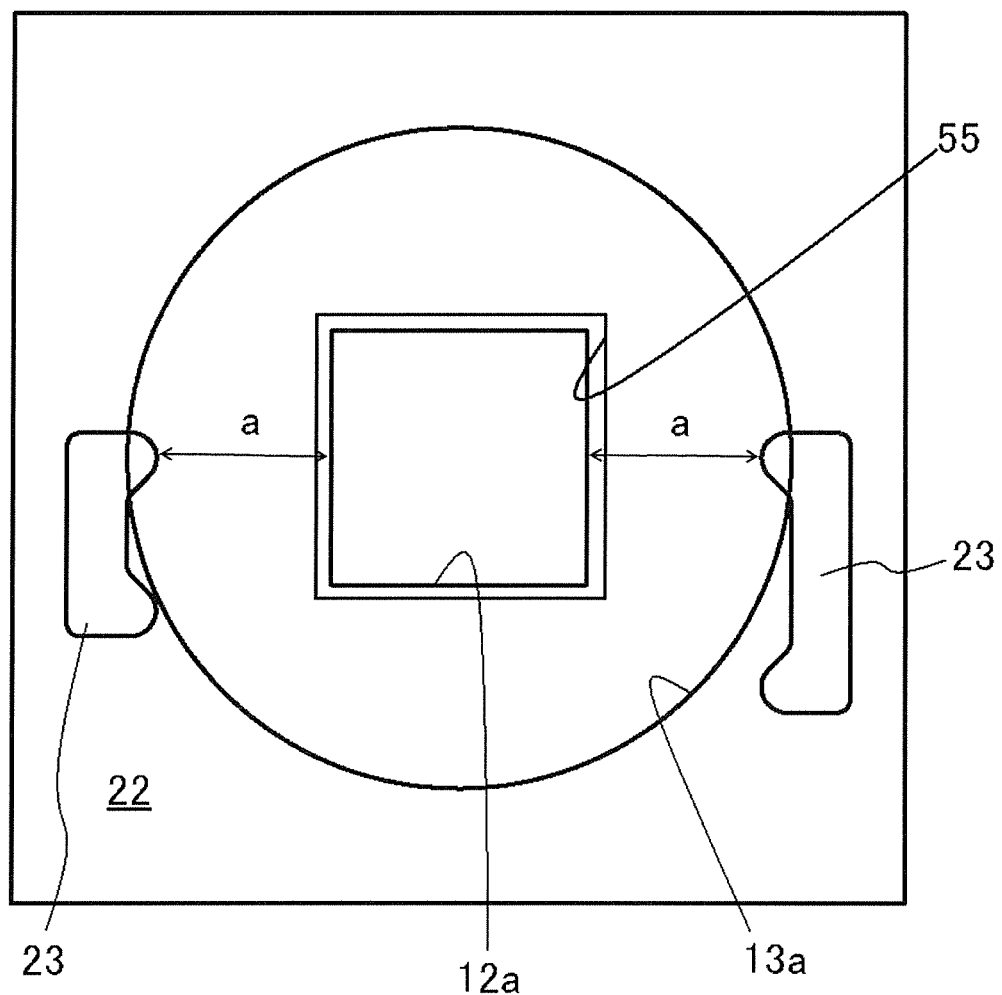
F I G. 4

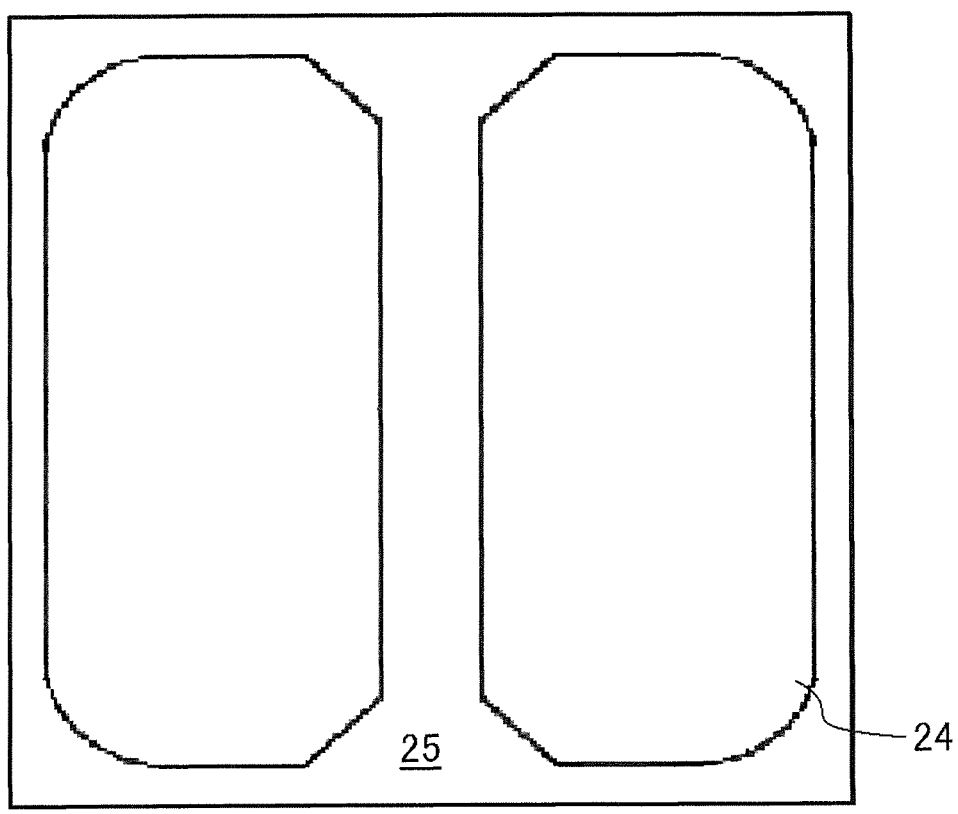
F I G. 6

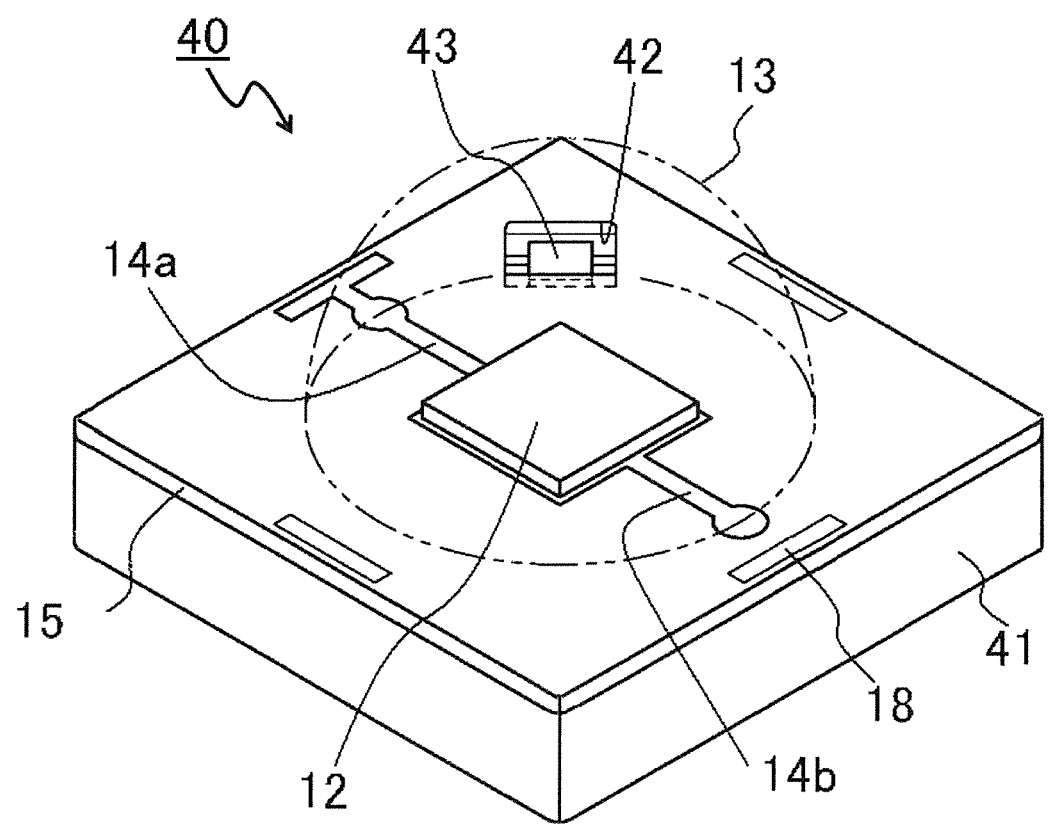
F I G. 8

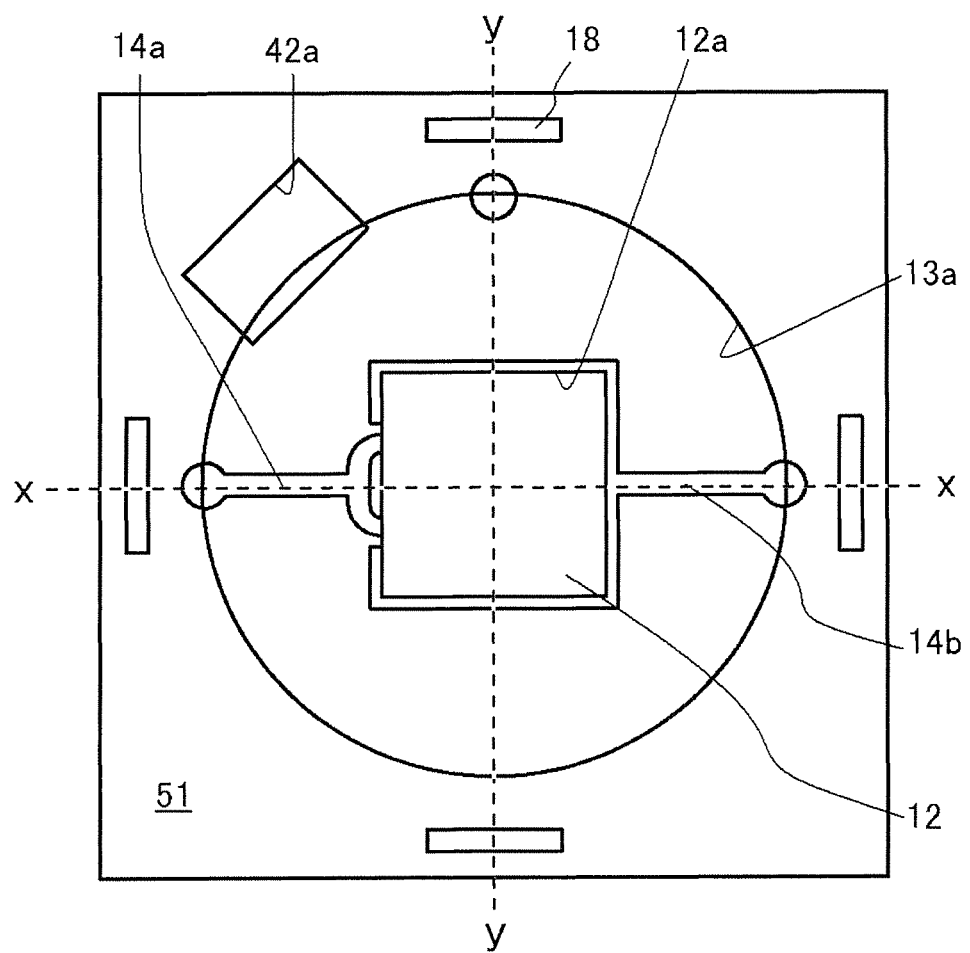
F I G. 9A

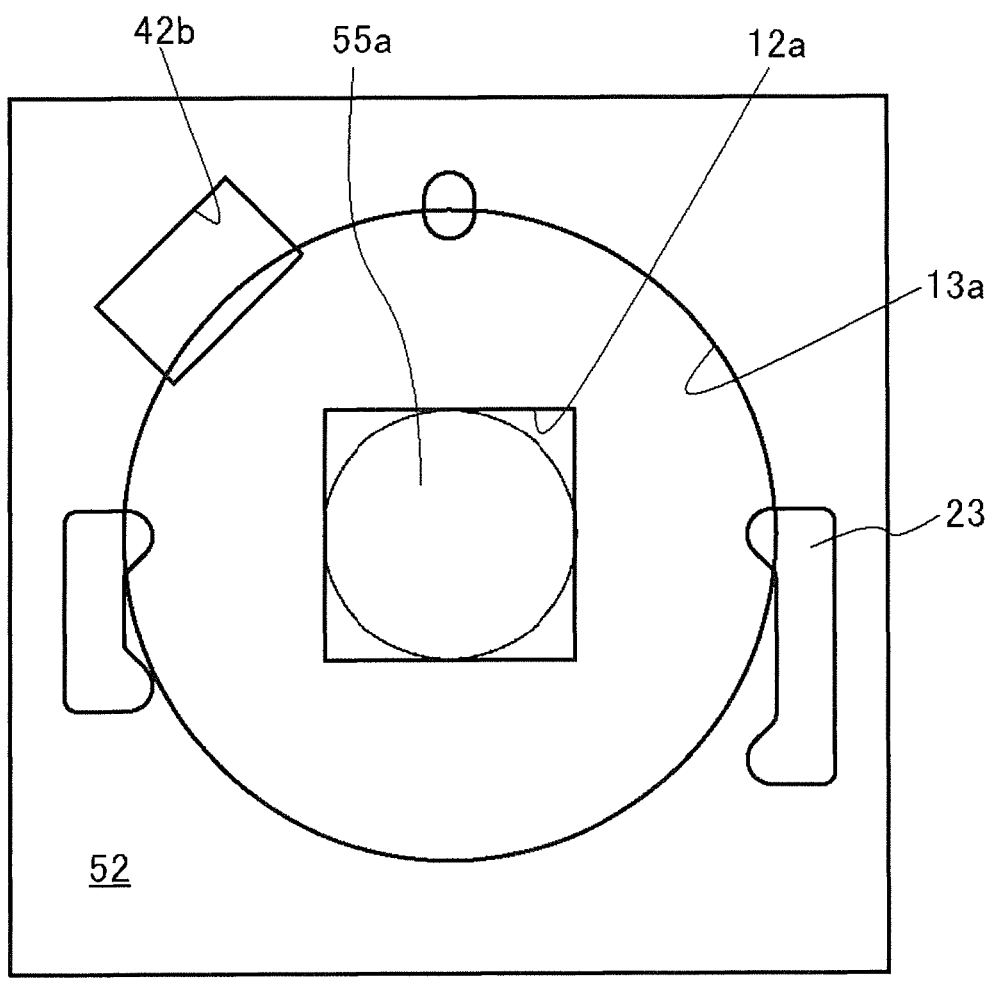
F I G. 10

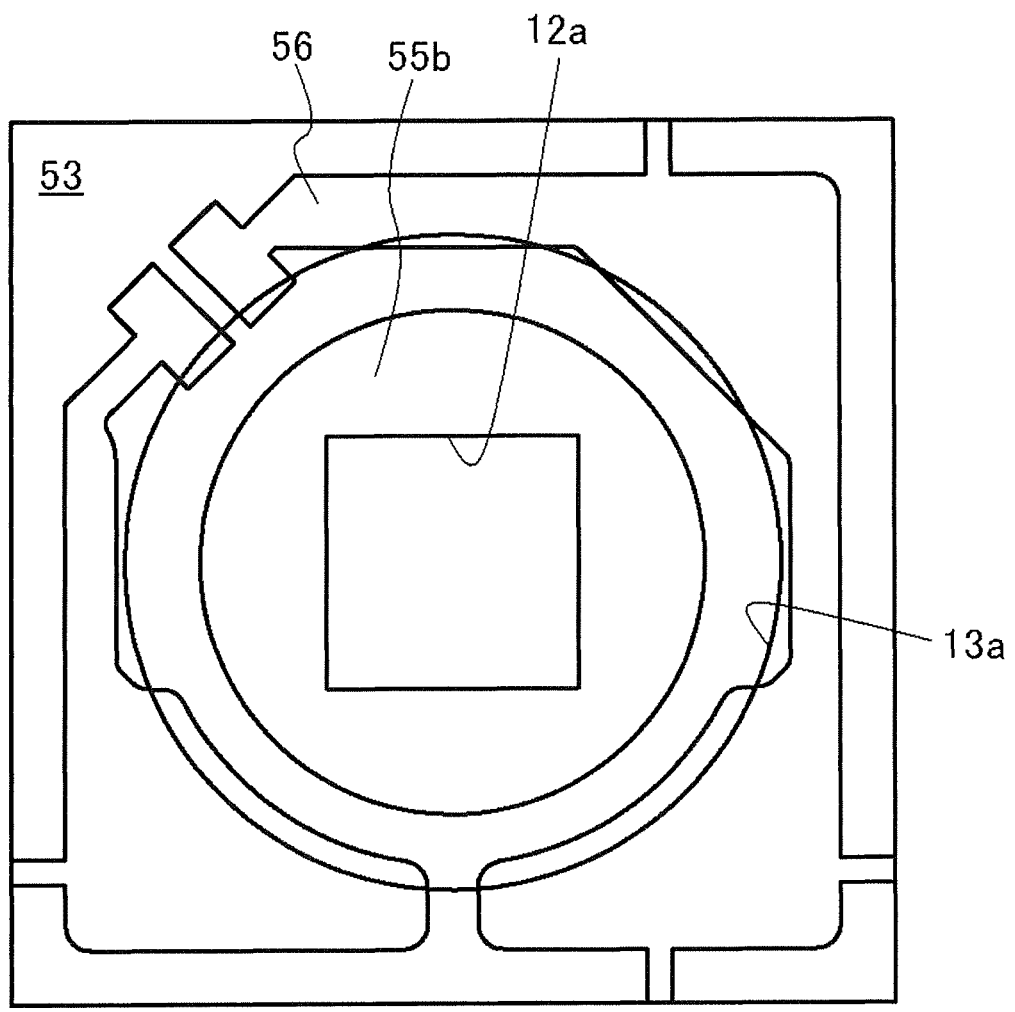
F I G. 11

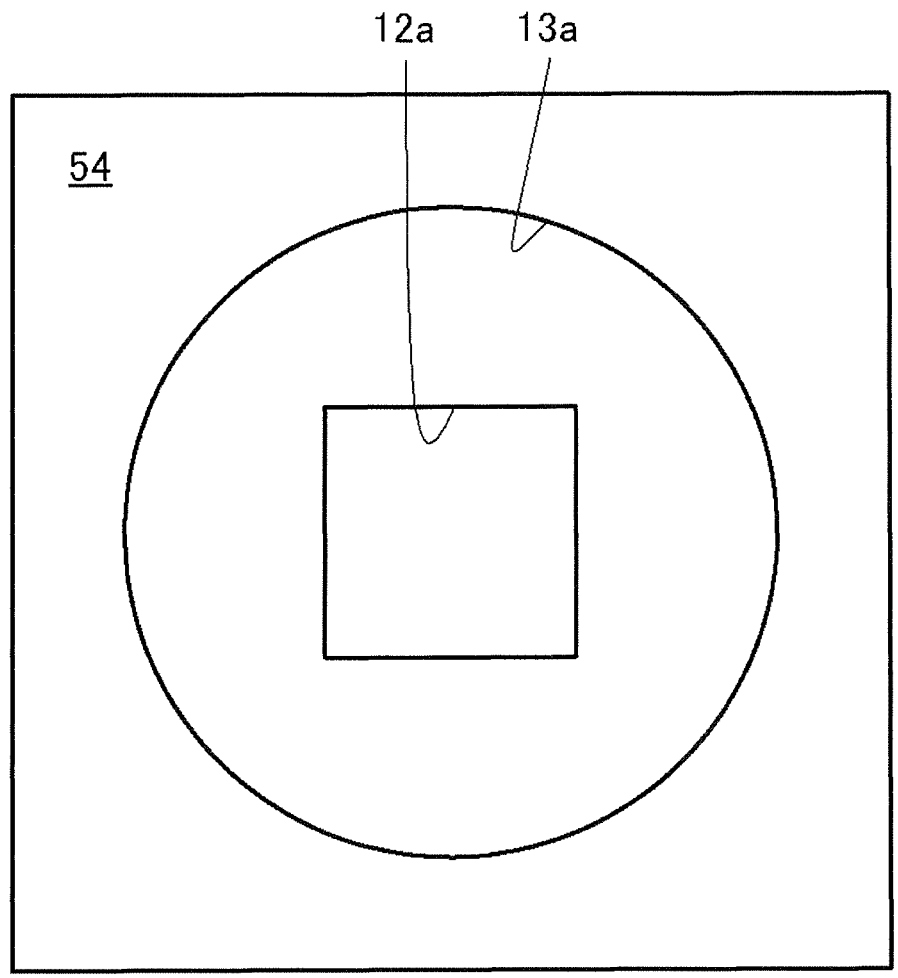
F I G. 12

US 8,759,867 B2

SEMICONDUCTOR LIGHT EMITTING DEVICE

CROSS-REFERENCE TO RELATED APPLICATIONS

This national phase application claims priority to Japanese Patent Application No. 2009-028687 filed on Feb. 10, 2009. The entire disclosure of Japanese Patent Application No. 2009-028687 is hereby incorporated herein by reference.

TECHNICAL FIELD

The present invention relates to a semiconductor light emitting device in which a semiconductor light emitting element is installed, and more precisely relates to a semiconductor light emitting device with improved light extraction efficiency.

BACKGROUND ART

As the output of light emitting diodes (LEDs) has risen in recent years, it has become advantageous to use a package in which the main material of the support substrate is a ceramic with excellent resistance to heat and light (see, for example, WO2006/046655).

In the conductive wiring of such a package, conductive wiring of a surface including the part where a light emitting element is mounted is usually connected to conductive wiring applied to the substrate on which the package is mounted, so it consists of conductive wires on the rear face of the package and an inner-layer wire that links the conductive wires on the rear face with conductive wiring on the front face.

In general, the material of these wires is black or a color that is close to black, so the wires may absorb light from the light emitting element. In view of this, the wiring exposed from the package is electroplated with gold, silver, or another such metal to suppress the absorption of light, while the inner-layer wire that is embedded in the package is not electroplated and remains black. Also, since ceramic is a material that is generally porous and translucent, some of the light emitted from the light emitting diode may be transmitted through the ceramic and absorbed by the inner-layer wire embedded in the ceramic. As a result, a problem was that this lowered the light extraction efficiency of a light emitting device.

SUMMARY

The present invention was conceived in light of the above problem, and it is an object thereof to provide a semiconductor light emitting device with which higher light emission efficiency can be obtained.

The semiconductor light emitting device has: a package constituted by the lamination of a first insulating layer having a pair of positive and negative conductive wires formed on its upper face, an inner-layer wire below the first insulating layer, and a second insulating layer below the inner-layer wire; a semiconductor light emitting element that has a pair of positive and negative electrodes on the same face side and that is disposed with these electrodes opposite the conductive wires; and a sealing member that covers the semiconductor light emitting element. A part of the conductive wires is formed extending to the outer edge of the sealing member from directly beneath the semiconductor light emitting element, on the upper face of the first insulating layer, and is connected to the inner-layer wire via a conductive wire disposed in the thickness direction of the package. The inner-layer wire is disposed so as to be spaced apart from the outer periphery of the semiconductor light emitting element in a see-through view of the package from the upper face side of the first insulating layer.

With this semiconductor light emitting device, it is preferable if the inner-layer wire is disposed on the outside of the outer edge of the sealing member.

It is also preferable if a mark is formed on the upper face of the first insulating layer, and the mark is disposed so as to be spaced apart from the outer periphery of the semiconductor light emitting element.

It is preferable if the package comprises a thermally conductive member directly beneath the semiconductor light emitting element.

It is preferable if the thermally conductive member has a shape that spreads out from under the semiconductor light emitting element toward the rear face of the package.

It is preferable if the thermally conductive member is constituted by a first thermal conduction layer under the semiconductor light emitting element, an insulating layer under this, and a second thermal conduction layer under the insulating layer.

It is preferable if the insulating layer is composed of a ceramic.

It is preferable if the thermally conductive member or the thermal conduction layer is made from CuW or CuMo.

With the present invention, less of the light emitted from the semiconductor light emitting element is absorbed by the inner-layer wire, so the light emission efficiency of the semiconductor light emitting device can be increased.

BRIEF DESCRIPTION OF THE DRAWINGS

FIG. 2 is an oblique view of the semiconductor light emitting device in an aspect of the present invention;

FIG. 3A is a plan view of the upper face of a first insulating layer in a package constituting the semiconductor light emitting device in FIG. 2;

FIG. 4 is a plan view of the upper face of a second insulating layer of the package constituting the semiconductor light emitting device in FIG. 2;

FIG. 6 is a plan view of the rear face of a third insulating layer of the package constituting the semiconductor light emitting device in FIG. 2;

FIG. 8 is an oblique view of the semiconductor light emitting device in another aspect of the present invention;

FIG. 9A is a plan view of the first insulating layer of the semiconductor light emitting device shown in FIG. 8;

FIG. 10 is a plan view of the second insulating layer of the package constituting the semiconductor light emitting device shown in FIG. 8;

FIG. 11 is a plan view of the third insulating layer of the package constituting the semiconductor light emitting device shown in FIG. 8; and FIG. 12 is a plan view of the fourth insulating layer of the package constituting the semiconductor light emitting device shown in FIG. 8.

DETAILED DESCRIPTION OF THE PREFERRED EMBODIMENTS

Figure 1A:
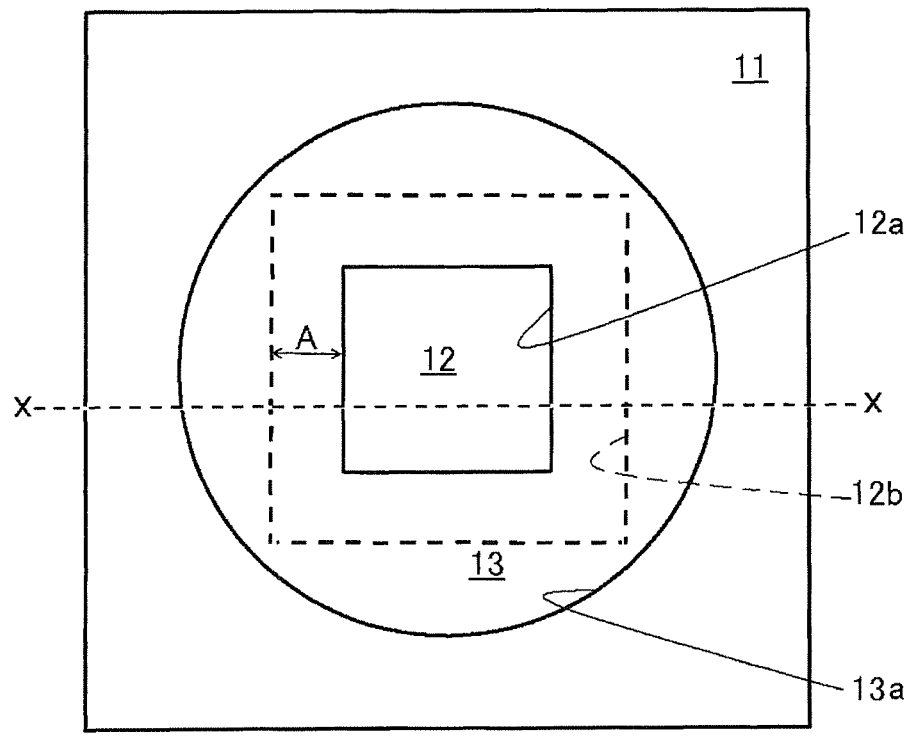
FIG. 1A is a simplified plan view of the upper face of a first insulating layer in the semiconductor light emitting device in one aspect of the present invention.

A preferred embodiment for working the present invention will now be described through reference to the drawings. In the following embodiment, a semiconductor light emitting device is used as an example for embodying the technological concept of the present invention, but the semiconductor light emitting device of the present invention is not limited to or by the following.

Also, this Specification does not limit the members given in the Claims to the members of the embodiments. Unless otherwise specified, the dimensions, materials, shapes, relative layouts, and so forth of the constituent parts discussed in the embodiments are given merely as examples and are not intended to limit the scope of the claims of the present invention. Furthermore, the size, positional relations, and so forth of the members shown in the drawings may be exaggerated for make the description clearer. In the following description, members that are the same or analogous will be given the same names or numbers, and may not be described again in detail. Further, the various elements constituting the semiconductor light emitting device of the present invention may be such that a plurality of elements are constituted by the same member and a plurality of elements are shared by a single member, or conversely the function of a single member may be divided up among a plurality of members.

The inventors conducted various studies aimed at suppressing the absorption of light by an inner-layer wire in a semiconductor light emitting device comprising a package constituted by the lamination of a first insulating layer having a pair of positive and negative conductive wires formed on its upper face, an inner-layer wire below the first insulating layer, and a second insulating layer below the inner-layer wire, a semiconductor light emitting element that has a pair of positive and negative electrodes on the same face side and that is disposed with these electrodes opposite the conductive wires, and a sealing member that covers the semiconductor light emitting element.

As a result, part of the conductive wires is formed extending in the outer edge direction of the sealing member from directly beneath the semiconductor light emitting element, on the upper face of the first insulating layer, and is connected to the inner-layer wire via a conductive wire disposed in the thickness direction of the package. Further, the inner-layer wire is disposed so as to be spaced apart from the outer periphery of the semiconductor light emitting element in a see-through view of the package from the upper face side of the first insulating layer. This is how the inventors arrived at solving the above-mentioned problem. An embodiment of the semiconductor light emitting device pertaining to the present invention will now be described in detail.

The semiconductor light emitting device of the present invention mainly comprises a package, a semiconductor light emitting element, and a sealing member. There are no particular restrictions on the package so long as it is in a form that is commonly used for manufacturing this type of semiconductor light emitting device, but includes at least a two-layer insulating layer (consisting of a first insulating layer and a second insulating layer), conductive wires formed on the upper face of the first insulating layer, and an inner-layer wire disposed between the first insulating layer and the second insulating layer.

The first insulating layer and the second insulating layer may be formed from any material that is an insulator and has heat resistance and suitable strength, with ceramics being particularly preferable.

Examples of ceramics include alumina, mullite, forsterite, glass ceramic, nitrides (such as AlN), and carbides (such as SiC). Of these, alumina or a ceramic having alumina as its main component is particularly preferable.

There are no particular restrictions on the thickness of the first insulating layer and the second insulating layer, but for example, the first insulating layer is at least 0.05 mm, preferably at least 0.1 mm, even more preferably at least 0.175 mm, even more preferably at least 0.225 mm, and even more preferably at least 0.275 mm, with at least 0.35 mm being even better. 1 mm or less is preferable, and 0.8 mm or less is better yet. That is, this means that the depth of the inner-layer wire disposed between the first insulating layer and the second insulating layer, and the depth from the upper face of the first insulating layer (upper face of the package) are within the above ranges. Thus, if the first insulating layer has a thickness such as this, the conductive wires formed on the upper face of the film can be securely insulated from the inner-layer wire formed under the first insulating layer. Also, the thickness of the first insulating layer combines with the wiring pattern of the inner-layer wire (discussed below) to prevent light emitted from the semiconductor light emitting element, or light that propagates through the interior of the sealing member (discussed below), from being absorbed by the inner-layer wire, and to further raise the light extraction efficiency.

The insulating layer constituting the package is not limited to having the two-layer structure consisting of the first insulating layer and the second insulating layer, and more layers may be laminated, for example. If the package is thus made up of multiple layers, there will be greater latitude in routing the wiring, less warping, and better flatness, and resistance to soldering cracking will be obtained.

The package may partially have an insulating layer composed of an insulating material other than a ceramic. Examples of this material include BT resin, glass epoxy, and epoxy resins.

The upper face of the first insulating layer and the second insulating layer, and particularly the upper face of the first insulating layer constituting the upper face of the package, is preferably substantially flat. This allows the light emitted from the semiconductor light emitting element (discussed below) to be extracted to the outside without being blocked. However, a recess for mounting a protective element may be formed in the insulating layers.

Conductive wires are formed in the upper face of the first insulating layer. The conductive wires function as a pair of electrodes (positive and negative) that are connected to the positive and negative electrodes of the semiconductor light emitting element, on the package upper face where the semiconductor light emitting element is mounted.

An inner-layer wire is disposed between the first insulating layer and the second insulating layer. The inner-layer wire is embedded between the first insulating layer and the second insulating layer, and connects with a conductive wire formed passing through from the upper face side of the package to the rear face side, and thereby functions as a wire that connects to the conductor wires on the upper face of the package and to the rear face wiring on the rear face of the package.

These conductive wires are usually formed from one or more layers of a metal or alloy layer whose main component is nickel, gold, copper, silver, molybdenum, tungsten, or the like. Also, the inner-layer wire is formed from one or more layers of a metal or alloy layer whose main component is molybdenum, tungsten, or the like. There are no particular restrictions on the method for forming the conductive wires and the inner-layer wire, and any method known in this field can be employed. For instance, the conductive wires can be formed by vapor deposition, sputtering, photolithography, printing, electroplating, or the like, or by a combination of these methods. A material with high reflectance, such as gold, silver, or the like, is preferable, particularly when plating.

The inner-layer wire can be formed by printing the surface of a green sheet of the ceramic used to form the first insulating layer and the second insulating layer with a conductive paste of tungsten, molybdenum, or the like, and laminating these green sheets.

There are no particular restrictions on the thickness, width, etc., of the conductive wires and the inner-layer wire, which can be suitably adjusted so that these wires will effectively exhibit their function.

The inner-layer wire is disposed to the outside of the outer edge of the sealing member (discussed below), spaced apart from the outer periphery of the semiconductor light emitting element (discussed below). That is, it is good for this inner-layer wire to be substantially not disposed directly beneath the region corresponding to the outer peripheral region of the semiconductor light emitting element in between the first insulating layer and the second insulating layer. In particular, in the outer peripheral region of the semiconductor light emitting element, light with 5 to 20% or more of the maximum brightness of the light emitting element also shines on the package surface, but if a wiring pattern such as this is used, even if the first insulating layer is made from a material that is translucent, the light emitted from the semiconductor light emitting element, or light that propagates through the interior of the sealing member, will not be absorbed by the inner-layer wire within a specific range of distance from the outer periphery of the semiconductor light emitting element (called the "outer peripheral region" in this Specification), optical loss can be prevented, and the light can be extracted more efficiently.

This will be described through reference to FIG. 1A. The outer peripheral region 12b of a semiconductor light emitting element 12 is a region having a specific width A from the outer edge 12a of the semiconductor light emitting element 12. Therefore, with a package 11 including a first insulating layer and a second insulating layer, there is substantially no inner-layer wire present in the region located within the outer peripheral region 12b and directly beneath the outer peripheral region (or in the region present between the first insulating layer and the second insulating layer) when seen in see-through view from the upper face side of the first insulating layer. It is good for this outer peripheral region to have, for example, a width A of at least about 0.2 mm from the outer edge 12a of the semiconductor light emitting element 12, with at least about 0.3 mm being preferable, and at least about 0.4 mm being even better. It is also preferable for the outer peripheral region to be a region on the inside of the outer edge 13a of a sealing member 13 (discussed below). Specifically, it is preferable for the inner-layer wire to be disposed on the outside of the outer edge 13a of the sealing member.

Rear face wiring that is electrically connected to the above-mentioned conductive wires or the inner-layer wire is usually formed on the rear face of the package, such as on the rear face of the second insulating layer. The result is that an electrical connection to a mounting substrate or a circuit board is effected by the conductive wiring on the rear face as an external terminal.

If the insulating layer includes three or more layers, the inner-layer wire may be disposed between any insulating layers. An inner-layer wire other than that between the first insulating layer and the second insulating layer may be provided in any region of the package.

Figure 1B:
FIG. 1B is a cross section in the x-x direction of the first insulating layer of the semiconductor light emitting device of the present invention.

The package preferably further comprises a thermally conductive member under the region where the semiconductor light emitting element is mounted. Herein, "under the mounting region" is a region underneath the semiconductor light emitting element and substantially on the inside of the outer edge 12a of the semiconductor light emitting element 12. In this case, the surface of the thermally conductive member is usually covered with an insulating layer, and conductive wiring that connects to the electrodes of the semiconductor light emitting element is disposed on the upper face of this insulating layer. The insulating layer may be the first insulating layer itself (see 21 in FIG. 1B), and it is good for part of the first insulating layer to cover the surface of the thermally conductive member (see FIG. 1C).

Figure 1C:
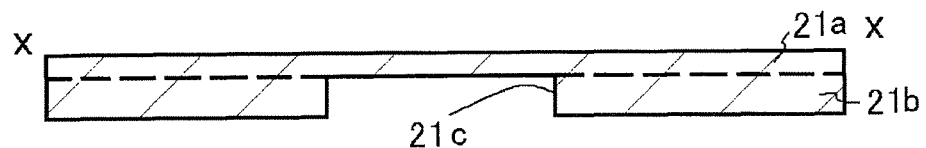
FIG. 1C is a cross section in the x-x direction of another first insulating layer of the semiconductor light emitting device of the present invention.

For example, as shown in the cross section of FIG. 1C, an example of the first insulating layer is one in which a first insulating layer 21 comprises on its inside a recess 21c for holding a thermally conductive member, so a layer 21a and a layer 21b are formed integrally, and the layer 21a covers the surface of the thermally conductive member. The thermally conductive member is preferably disposed so as to be embedded in the interior of the package. "Embedded" here refers to a state in which the entire thermally conductive member is covered substantially completely by an insulating layer.

More specifically, the thermally conductive member is disposed beneath the conductive wires with the insulating layer forming the semiconductor light emitting element mounting face (may be the first insulating layer) in between. The thickness of the insulating layer in this case is 0.1 mm or less, and preferably 0.09 mm or less, and more preferably 0.08 mm or less, and even more preferably about 0.05 mm. Forming a thin film such as this makes it possible to ensure adequate heat dissipation by the thermally conductive member, just as when the semiconductor light emitting element is mounted directly on the thermally conductive member, and also allows the semiconductor light emitting device to be made smaller by overlapping the thermally conductive member with the conductive wires serving as electrodes for connecting to the electrodes of the semiconductor light emitting element while ensuring insulation characteristics.

The thermally conductive member is disposed beneath the conductive wires, with the insulating layer in between, on the rear face of the package, that is, the mounting face to a mounting substrate or circuit board. Examples of the insulating layer in this case were given above, and the thickness thereof is 0.1 mm or less, and preferably 0.09 mm or less, and more preferably 0.08 mm or less, and even more preferably about 0.05 mm. Forming a thin film such as this makes it possible to ensure adequate heat dissipation from the rear face by the thermally conductive member. It also allows good insulation to be ensured while overlapping the thermally conductive member with the rear face wiring on the rear face side serving as an external terminal. Consequently, the semiconductor light emitting device can be made smaller, and the surface area of the external terminal can be increased and this can be used to increase the contact surface area with the circuit board, so as to minimize the effect of soldering cracking and so forth, and improve adhesion.

An example of the thermally conductive member is one whose thermal conductivity is higher than that of the first insulating layer and second insulating layer constituting the package, such as one having a thermal conductivity of at least about 100 W/m·K, and preferably at least about 200 W/m·K. For example, it can be formed from a ceramic such as aluminum nitride, a metal such as copper, aluminum, gold, silver, tungsten, iron, or nickel, an iron-nickel alloy, phosphor bronze, iron-containing copper, or CuW, or one of these materials that has been plated with silver, aluminum, copper, gold, or another such metal film. Of these, CuW is preferable. This allows the thermally conductive member to be formed simultaneously with the package by lamination or formation of the green sheet of the package, firing, and so forth.

When heat dissipation and reduction of the package size are taken into account, it is good for the thermally conductive member to have a thickness of at least 0.05 mm, for example, with at least 0.175 mm being preferable. A thickness of 0.5 mm or less is also preferable. There are no particular restrictions on the shape of the thermally conductive member, but it is preferable to use a shape that widens toward the rear face of the package from directly beneath the semiconductor light emitting element, that is, a shape such that the planar shape becomes larger. This improves heat dissipation.

The thermally conductive member is preferably constituted by a first thermal conduction layer disposed directly beneath the semiconductor light emitting element, an insulating layer disposed under this, and a second thermal conduction layer disposed under the insulating layer. Consequently, the insulating layer avoids contact between the inner-layer wire and the thermal conduction layers, so short circuiting is prevented, and a more reliable semiconductor light emitting device can be obtained.

There are no particular restrictions on the thickness of the insulating layer here, which can be suitably adjusted according to the materials of the first and second thermal conduction layers, the film thickness, the type of light emitting element, the size and thickness of the package, and so forth. This insulating layer is preferably composed of the above-mentioned ceramic.

The package may have, besides the conductive wires, a separate mark formed of the same or different material from that of the conductive wires, on the surface of the first insulating layer. This mark is disposed spaced apart from the outer periphery of the semiconductor light emitting element. That is, it is preferably provided to the outside of the outer edge of the semiconductor light emitting element. Examples of this mark include a mark consisting of bumps or recesses or the like formed from the same material as the insulating layer, etc., and an identification/recognition mark such as an alignment mark formed from the same material and in about the same thickness as the conductive wires. If the mark is formed from the same material as the inner-layer wire, and is not electrically connected to the conductive pattern, the surface of the mark will not be plated with a metal having high optical reflectance, such as silver, so the mark will still be black. Thus, forming the mark outside the outer peripheral region can prevent the absorption of light that would otherwise be attributable to the mark.

There are no particular restrictions on the shape and size of the package, but when the above-mentioned embedding of the thermally conductive member, reliability as affected by thermal cycles after mounting of the semiconductor light emitting device on a wiring board, and so forth are taken into account, for example, an example is a cuboid shape or a similar shape that measures at least about 0.5 mm and no more than about 5 mm along one side of a face (the light take-off face), and preferably at least about 1 mm and no more than about 3.5 mm. Also, when the above-mentioned embedding of the thermally conductive member, insulation from the thermally conductive member, and so forth are taken into account, it is good for the total thickness to be at least 0.05 mm, with at least 0.175 mm being preferable, and for the thickness to be no more than 1 mm, and preferably no more than 0.5 mm.

The semiconductor light emitting element is preferably an element that is usually called a light emitting diode. Examples include those in which is formed a laminar structure including an active layer, by various semiconductors such as InN, AlN, GaN, InGaN, AlGaN, InGaAlN, and other such nitride semiconductors, group III-V compound semiconductors, and group II-VI compound semiconductors. Of these, one having an active layer that emits blue light and is composed of a nitride semiconductor is preferable. The emission wavelength of the resulting light emitting element can be varied from the ultraviolet region to red by changing the material of the semiconductor, the crystal mixture ratio, the indium content of the InGaN in the active layer, the type of impurity with which the active layer is doped, and so forth.

The semiconductor light emitting element in this aspect has a pair of positive and negative electrodes on the same side with respect to the active layer.

The semiconductor light emitting element is mounted on the conductive wires of the package. For example, the semiconductor light emitting element is die-bonded to a specific region of the package by using a solder such as eutectic Au—Sn, a braze such as a low-melting point metal, a conductive paste such as silver gold, or palladium, or the like.

The electrodes formed on the semiconductor light emitting element are connected to the conductive wires of the package. The positive electrode of the semiconductor light emitting element, which has positive and negative electrodes on the same face side, is connected to the positive electrode (conductive wire) of the package, and the negative electrode of the semiconductor light emitting element to the negative electrode (conductive wire) of the package, by soldering or a bump.

A plurality of semiconductor light emitting elements, rather than just one, may be installed in the semiconductor light emitting device. In this case, a plurality of semiconductor light emitting elements that emit light of the same color may be combined, or a plurality of semiconductor light emitting elements with different emission colors may be combined so as to correspond to R (red light), G (green light), and B (blue light). When a plurality of semiconductor light emitting elements is installed, the semiconductor light emitting elements may be electrically connected to the electrodes of the package in any connection relationship, such as in series or in parallel.

Also, with the semiconductor light emitting device of the present invention, the semiconductor light emitting element installed in the package is usually covered with a sealing member. This sealing member covers the semiconductor light emitting element installed in the package so that none of it, including its positive and negative electrodes, is exposed to the outside air. The sealing member can have any of a variety of shapes that take optical characteristics into account, such as a convex lens shape for converging light from the light emitting element in the front face direction.

There are no particular restrictions on the material of the sealing member, so long as it is translucent, and the material can be selected from among those usually used in this field, such as one or more kinds of resin such as epoxy resins, acrylic resins, acrylate resins, methacrylic resins (such as PMMA), fluororesins, silicone resins, modified silicone resins, or modified epoxy resins, or a liquid crystal polymer. Of these, epoxy resins, silicone resins, and modified silicone resins are better, with silicone resins having excellent light resistance being particularly good. The sealing member can be formed on the package by subjecting these materials to compression molding, transfer molding, or injection molding, or on an aggregate board prior to separation into individual packages.

The phrase "is translucent" as used here means that the sealing member transmits light from the semiconductor light emitting element to the extent that the sealing member can be seen through.

This material may, for example, contain added components such as fluorescent dyes, pigments, fillers, or diffusers. Examples of these added components are the fluorescent dyes, pigments, fillers, diffusers, and so forth discussed in WO2006/038502 and Japanese Laid-Open Patent Application 2006-229055, for example.

A protective element may be installed in the semiconductor light emitting device of the present invention. There may be just one protective element, or there may be a plurality. Also, the protective element may be formed in the interior of the package so that it will not block light from the semiconductor light emitting element, or the package may be provided with a recess for holding a protective element. The position where the recess is provided should be selected so as to avoid blocking the light from the semiconductor light emitting element. For example, a good place is to the outside of the outer edge of the sealing member, or in the vicinity thereof.

There are no particular restrictions on the protective element, and any known type that is installed in a semiconductor light emitting device may be used. For instance, it can be a circuit protection element (such as an antistatic protective element) for overheating, over-voltage, over-current, or the like. More specifically, a Zener diode or a transistor can be used.

The semiconductor light emitting device of the present invention will now be described more specifically through reference to the drawings.

Example 1

As shown in FIG. 2, the semiconductor light emitting device 10 in this Example comprises a package 11, a semiconductor light emitting element 12 (LED chip) disposed in this package 11, and a sealing member 13 that covers this semiconductor light emitting element 12.

Figure 3B:
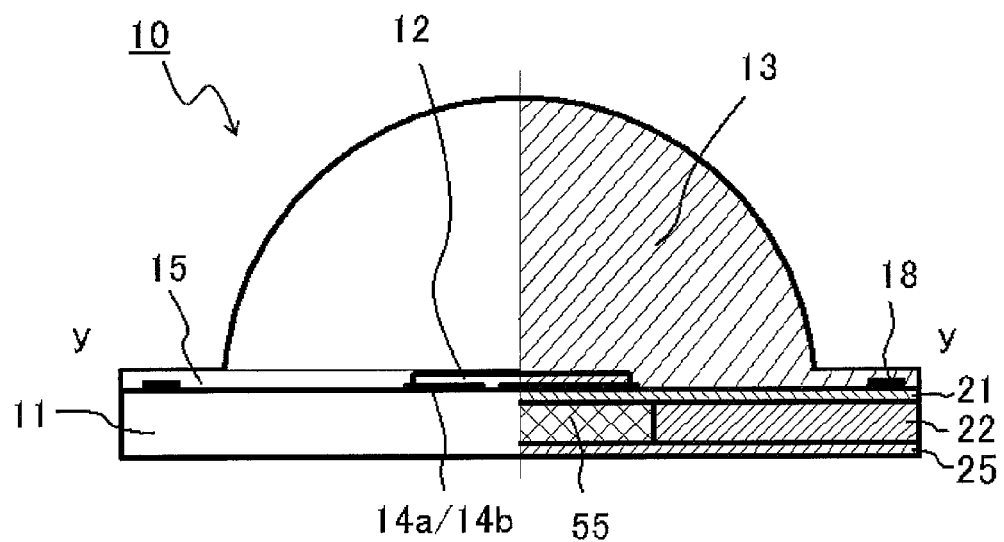
FIG. 3B is a cross view in the y-y line direction in FIG. 3A (one half is a partial side view)
Figure 3C:
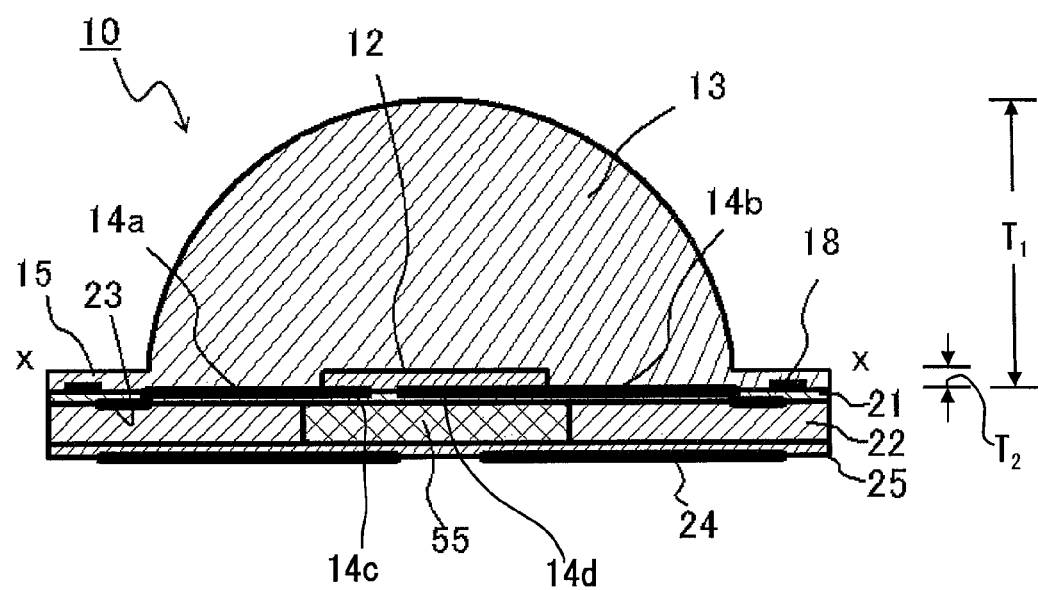
FIG. 3C is a cross view in the x-x line direction in FIG. 3A.

As shown in the cross sections of FIGS. 3B and 3C, the package 11 is produced by laminating a first insulating layer 21 on whose upper face is formed a pair of positive and negative conductive wires, an inner-layer wire 23 under the first insulating layer 21, and a second insulating layer 22 under this inner-layer wire 23.

As shown in FIG. 3C, the semiconductor light emitting element 12 has a pair of positive and negative electrodes 14c and 14d on the same face side, and these electrodes are disposed facing a pair of positive and negative conductive wires 14a and 14b.

As shown in FIGS. 3A and 3C, part of the pair of positive and negative conductive wires 14a and 14b is formed extending in the outer peripheral direction of the sealing member 13 from directly beneath the semiconductor light emitting element 12 on the upper face of the first insulating layer 21 (part of the package 11), and is also connected to the inner-layer wire 23 via another conductive wire disposed in the thickness direction of the package 11.

As shown in FIGS. 3A and 4, this inner-layer wire 23 is disposed so as to be spaced apart from the outer periphery of the semiconductor light emitting element 12 in a see-through view of the package 11 from the upper face side of the first insulating layer 21. Also, in the same view, the inner-layer wire 23 is disposed to the outside of the outer edge 13a of the sealing member 13. The semiconductor light emitting device of this Example will now be discussed in detail.

The semiconductor light emitting device 10 has the conductive wires 14a and 14b formed on the upper face of an insulated package 11 composed of a ceramic, alumina, and having a substantially cuboid external shape (measuring approximately 3.5×3.5 mm on one side of the planar shape, and has an LED chip installed as the semiconductor light emitting element 12 on part of the conductive wires 14a and 14b.

As shown in FIGS. 3A to 3C, the package 11 is produced by laminating the first insulating layer 21 on whose upper face are formed the conductive wires 14a and 14b, the inner-layer wire 23 that is under this first insulating layer 21, and the second insulating layer 22 that is under this inner-layer wire 23. A third insulating layer 25 is laminated under the second insulating layer 22.

As shown in FIG. 3A, the first insulating layer 21 comprises an alignment mark 18 and the conductive wires 14a and 14b formed on the upper face of the first insulating layer 21 (0.175 mm thick) and a conductive wire (see FIG. 3C) that is embedded so as to pass through the first insulating layer 21 and directly beneath the conductive wires 14a and 14b.

Part of the conductive wires 14a and 14b is formed extending in the direction of the outer edge 13a (x-x direction) of the sealing member 13 from directly beneath the semiconductor light emitting element 12 on the upper face of the first insulating layer 21 (part of the package 11), and as shown in FIG. 3C, is connected to the inner-layer wire 23 via another conductive wire disposed in the thickness direction of the package 11.

As shown in FIG. 4, the second insulating layer 22 (0.175 mm thick) comprises the inner-layer wire 23 formed on its upper face, and a conductive wire (not shown) embedded so as to pass through the interior of the second insulating layer 22 in the thickness direction, and connected to the inner-layer wire 23.

The inner-layer wire 23 is disposed so as to be spaced apart from the outer periphery of the semiconductor light emitting element 12 in a see-through view of the package 11 from the upper face side of the first insulating layer 21. In other words, this inner-layer wire 23 is substantially not disposed directly beneath the region corresponding to the outer peripheral region of the semiconductor light emitting element 12 in between the first insulating layer 21 and the second insulating layer 22.

In this Example, the inner-layer wire 23 disposed between the first insulating layer 21 and the second insulating layer 22 is separated from the outer edge 12a of the LED chip by a minimum distance a of about 0.7 mm.

Figure 5:
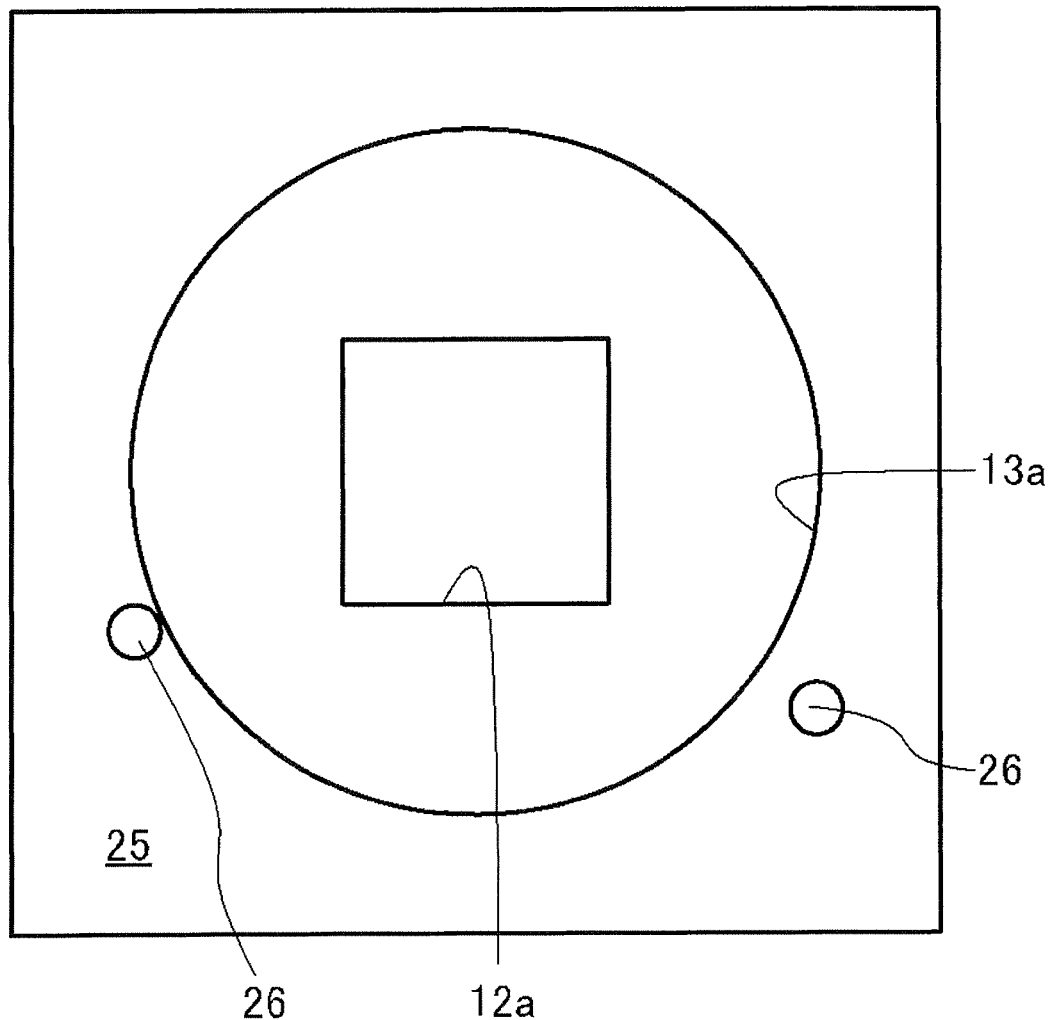
FIG. 5 is a plan view of the upper face of a third insulating layer of the package constituting the semiconductor light emitting device in FIG. 2.

As shown in FIG. 5, a conductive wire 26 that is connected to the conductive wire embedded in the second insulating layer 22 is embedded in the third insulating layer (0.05 mm thick) so as to pass through its interior. As shown in FIG. 6, a rear face wiring pattern 24 is formed on the rear face.

The first insulating layer 21, the second insulating layer 22, the third insulating layer 25, the inner-layer wire 23, and the rear face wiring pattern 24 are formed integrally by firing ceramic green sheets.

The conductive wires 14a and 14b and the inner-layer wire 23 are formed by firing a conductive paste that is a mixture of copper, molybdenum, and tungsten powders simultaneously the ceramic that makes up the package. The conductive wires 14a and 14b are further subjected to electroplating with gold on their surface.

For the sake of clarity, FIGS. 3A and 4 also show the outer edge 12a of the LED chip, the semiconductor light emitting element 1, and the outer edge 13a of the sealing member 13.

The semiconductor light emitting element 12 has the pair of positive and negative electrodes 14c and 14d on the same face side, and these electrodes are disposed opposite the conductive wires 14a and 14b.

On the package 11 is formed a member that covers the entire surface of at least the semiconductor light emitting element 12 and the conductive wires 14a and 14b, substantially corresponding to the shape upper face of the package 11. This member is formed by the compression molding of a silicone resin, and is made up of the sealing member 13 which has a convex lens shape and a flange 15 that covers the alignment mark 18 on the upper face of the package 11 and is formed connected to the outer edge of the sealing member 13. The upper face of the flange 15 is a substantially flat face that is parallel to the upper face of the package 1, and the size (volume) of the flange 15 is sufficiently smaller than the size of the entire sealing member 13. For example, the sealing member 13 in this Example is a substantially hemispherical convex lens with a radius of about 1.20 to 1.50 mm, having a thickness $T_1$ (see FIG. 3C). The flange 15 is a thin film with a thickness of about 50 to 100 μm (thickness $T_2$ in FIG. 3C). The thickness $T_1$ is greater than the thickness $T_2$, as shown in FIG. 3C. Therefore, only a tiny amount of light propagates through the flange 15. Also, the inner-layer wire 23 is disposed to the outside of the outer edge of the sealing member 13 (that is, the boundary between the sealing member 13 and the flange 15) as seen in a see-through view of the first insulating layer from the upper face side of the package. Accordingly, with the semiconductor light emitting device pertaining to this Example, there is less absorption of light by the inner-layer wire 23.

The alignment mark 18 is formed to the outside of the outer edge of the sealing member 13 on the upper face of the package 11. This alignment mark 18 is used to measure if there is deviation in the molding position of the sealing member 13, or as a reference in making individual packages 11 from an aggregate board.

As shown in FIGS. 3B and 3C, a thermally conductive member 55 is disposed in this semiconductor light emitting device 10 in a form that is somewhat larger than the semiconductor light emitting element 12, so as to pass through the second insulating layer 22 in the thickness direction, and the upper face and rear face of the thermally conductive member 55 are covered by the first insulating layer 21 and the third insulating layer 25.

Figure 7A:
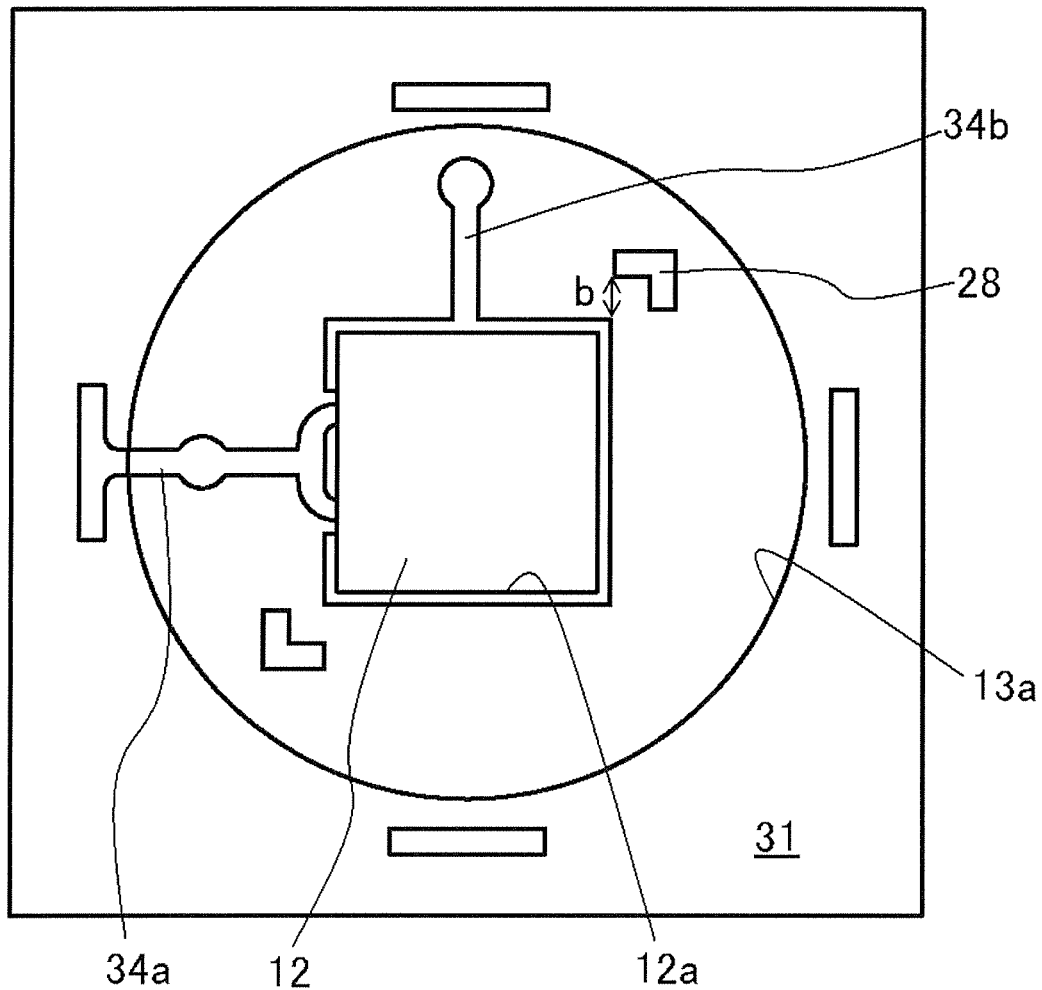
FIG. 7A is a plan view of the first insulating layer of a semiconductor light emitting device given for comparison with the semiconductor light emitting device of the present invention.
Figure 7B:
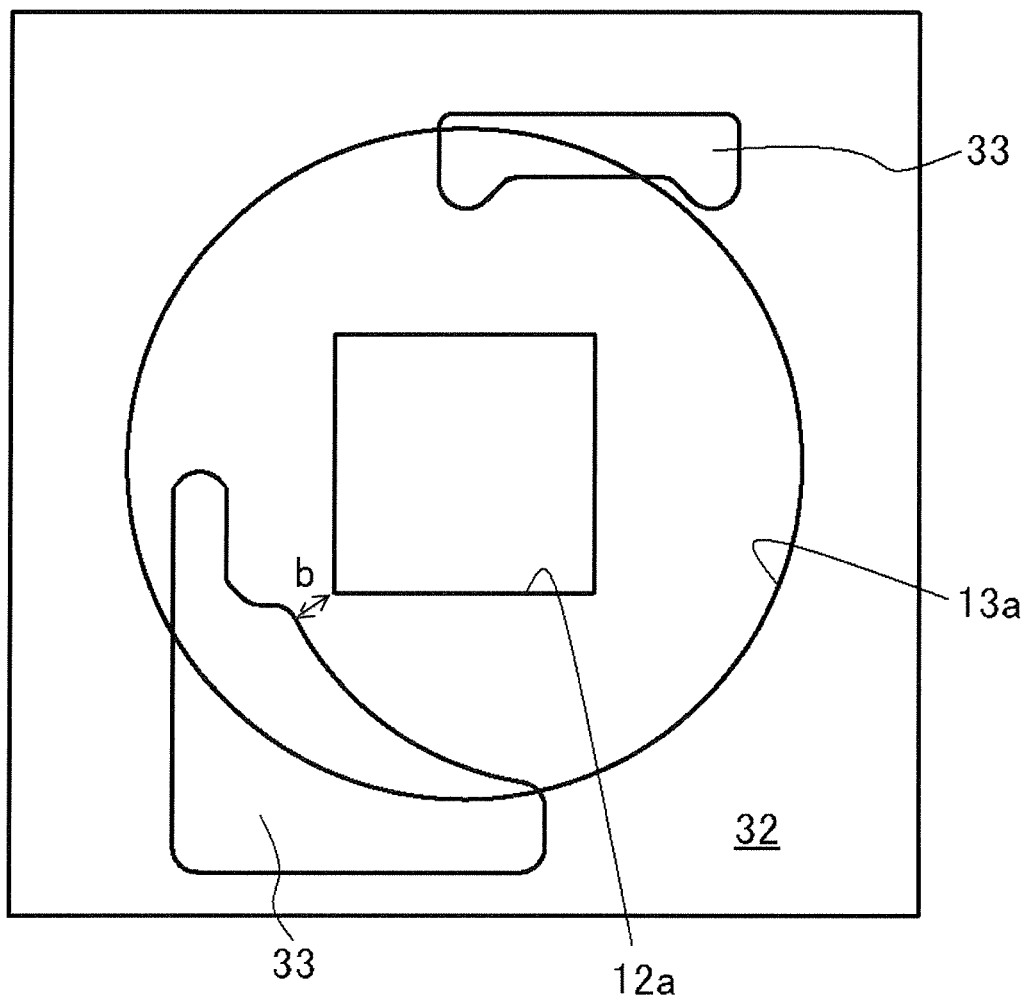
FIG. 7B is a plan view of the second insulating layer of a semiconductor light emitting device given for comparison with the semiconductor light emitting device of the present invention.

As shown in FIGS. 7A and 7B, for the sake of comparison, the same materials were used to form a package composed of: an alignment mark 28 separated by a distance b of about 0.15 mm from the outer edge 12a of the semiconductor light emitting element 12 and conductive wires 34a and 34b on the upper face of a first insulating layer 31; and an inner-layer wire 33 separated by a distance b of about 0.15 mm from the outer edge 12a of the semiconductor light emitting element 12, on the surface of a second insulating layer 32; and assembly was performed in the same manner as with the above-mentioned semiconductor light emitting device 10.

The light flux was measured for both of the semiconductor light emitting devices obtained. As a result, it was confirmed that the light flux increased by 6% in the semiconductor light emitting device 10 in Example 1 versus the comparative example. Specifically, it was confirmed that more light was extracted from the semiconductor light emitting device when the distance from the outer edge of the semiconductor light emitting element to the inner-layer wire was greater.

With the semiconductor light emitting device of this Example, a thermally conductive member is embedded beneath the LED chip and in the interior of the package, and as a result heat dissipation by the thermally conductive member can be ensured on a part with when the semiconductor light emitting element is installed directly on the thermally conductive member, so heat generated from the light emitting element can escape more efficiently. Also, since an insulating layer is in between the conductive wires and the thermally conductive member, insulation is ensured, effectively preventing short-circuiting between wiring, electrodes, etc., of the conductive wires, circuit board, and so forth, while it is possible to overlap the conductive wires and the thermally conductive member, so the semiconductor light emitting device can be smaller and thinner. Furthermore, structural restrictions on electrode working and the like are kept to a minimum, which affords greater latitude in designing the light emitting element.

Example 2

As shown in FIG. 8, a semiconductor light emitting device 40 in this Example has the conductive wires 14a and 14b, the alignment mark 18, and so forth formed and the semiconductor light emitting element 12 installed substantially the same as with the semiconductor light emitting device 10 in Example 1, except that a recess 42 is provided near the outer edge of the sealing member 13 on the surface of a package 41, a protective element 43 is installed in this recess, and a thermally conductive member with a two-stage structure is embedded directly beneath the LED chip 12.

That is, the first insulating layer 51 shown in FIG. 9A (0.05 mm thick), the second insulating layer 52 shown in FIG. 10 (0.175 mm thick), the third insulating layer 53 shown in FIG. 11 (0.175 mm thick), and the fourth insulating layer 54 shown in FIG. 12 (0.05 mm thick) are laminated and fired to form a package 41. These insulating layers are formed from ceramic green sheets made from alumina.

As shown in FIG. 9A, the package 41 of this semiconductor light emitting device 40 has the conductive wires 14a and 14b and the alignment mark 18 formed in the same manner as in Example 1 on the upper face of the first insulating layer 51. An opening 42a is formed at a position corresponding to the outer edge 13a of the sealing member 13.

Figure 9B:
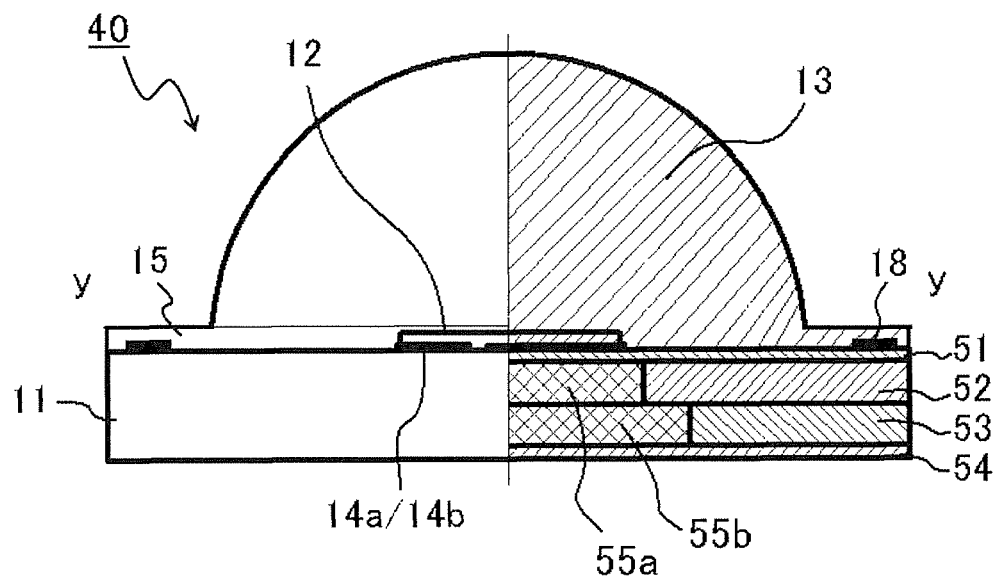
FIG. 9B is a cross section in the y-y line direction of FIG. 9A (the left half is a partial side view)
Figure 9C:
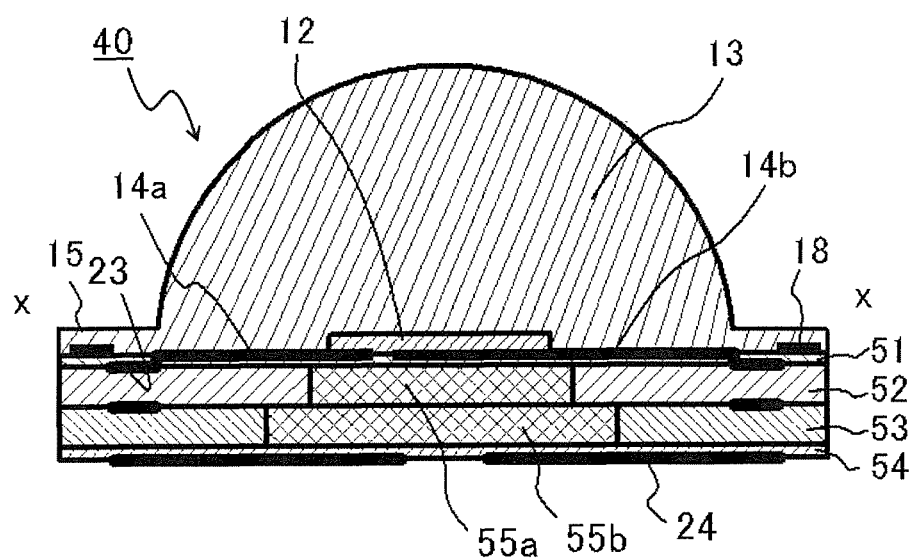
FIG. 9C is a cross section in the x-x line direction of FIG. 9A.

Also, as shown in FIG. 9C, a conductive wire (not shown) is formed directly beneath the conductive wires 14a and 14b, embedded so as to pass through the first insulating layer 51.

As shown in FIG. 10, on the surface of the second insulating layer 52 are formed the inner-layer wire 23 and, directly beneath the inner-layer wire 23, a conductive wire (not shown) embedded so as to pass through the second insulating layer 52 in the thickness direction. Also, an opening 42b is formed at a position corresponding to the outer edge 13a of the sealing member 13. Further, as shown in FIGS. 9B and 9C, a through-hole is provided in the center of the second insulating layer 52, and a thermally conductive member 55a (0.175 mm thick) composed of CuW and in the form of a disk having a diameter of about 1.2 mm is embedded at a position corresponding to where the through-hole is directly beneath the LED chip 12.

As shown in FIG. 11, a wiring pattern 56 used for a protective element 43 is formed on the surface of the third insulating layer 53 so as to be between the second insulating layer 52 and the third insulating layer 53, so that part of the pattern is exposed through the opening 42a in the first insulating layer 51 (see FIG. 9A) and the opening 42b in the second insulating layer 52 (see FIG. 10). Also, as shown in FIGS. 9B and 9C, a through-hole is provided in the center of the third insulating layer 53, and a thermally conductive member 55b (0.175 mm thick) composed of CuW and in the form of a disk having a diameter of about 1.6 mm is embedded at a position corresponding to where the through-hole is directly beneath the LED chip 12.

As shown in FIG. 12, a wiring pattern is not formed on the upper face of the fourth insulating layer 54, but a rear face wiring pattern is formed on the rear face just as in FIG. 6. This fourth insulating layer 54 can completely cover the rear face side of the thermally conductive member 55b.

With the semiconductor light emitting device of this Example, in addition to the effects of Example 1, in particular, the diameter of the thermally conductive member 55b fitted into the third insulating layer 53 is larger than the diameter of the thermally conductive member 55a fitted into the second insulating layer 52. Consequently, a step is formed on the side face of the shape of the overall thermally conductive member formed by the thermally conductive member 55a and the thermally conductive member 55b. That is, the thermally conductive member has a shape that widens from directly beneath the semiconductor light emitting element toward the rear face of the package. A shape such as this keeps to a minimum the absorption of light by the thermally conductive member directly beneath the LED chip.

Furthermore, to enhance this effect, the surface area in the horizontal direction of the thermally conductive member fitted into the second insulating layer directly beneath the LED chip is preferably about the same as the surface area in the horizontal direction of the LED chip.

Also, since the thermally conductive member is formed wider on the rear face side of the package, heat dissipation can be improved from the semiconductor light emitting element to the rear face of the package.

With this Example, although not shown in the drawings, an insulating layer is preferably disposed between the thermally conductive members fitted into the second insulating layer 52 and the third insulating layer 53. That is, the thermally conductive member is preferably made up of a first thermal conduction layer directly beneath the semiconductor light emitting element, a insulating layer under this, and a second thermal conduction layer under this insulating layer. The surface area of this insulating layer is preferably greater than the surface area of the upper face of the second thermal conduction layer disposed under the insulating layer. For example, the insulating layer disposed between the disk-shaped first thermal conduction layer fitted into the first insulating layer and the disk-shaped second thermal conduction layer fitted into the second insulating layer may have a surface area that is larger than the disk-shaped first thermal conduction layer fitted into the second insulating layer, and larger than the surface area of the disk-shaped second thermal conduction layer fitted into the third insulating layer. The thickness of the insulating layer disposed between the first thermal conduction layer and the second thermal conduction layer should be enough to allow good insulation without decreasing the heat dissipation property of the thermally conductive member.

Disposing an insulating layer such as this prevents short-circuiting by preventing contact between the inner-layer wire of the package and the thermally conductive member under the insulating layer, so a more reliable light emitting element can be obtained.

The semiconductor light emitting device of the illustrated embodiments can be used easily, simply, and accurately in the manufacture of various devices in which a semiconductor light emitting element is installed, and more specifically, semiconductor light emitting devices that can be used for a variety of lighting devices, including not only lighting devices used in image reading devices in facsimiles, copiers, hand scanners, and so forth, but also in flashlights, illumination light sources, LED displays, backlight light sources for portable telephones and the like, signaling devices, lighting switches, automotive brake lamps, various sensors, various indicators, and so forth.

The invention claimed is:

1. A semiconductor light emitting device, comprising:
    a package constituted by the lamination of a first insulating layer having a pair of positive and negative conductive wires formed on its upper face, an inner-layer wire below the first insulating layer, and a second insulating layer below the inner-layer wire;
    a semiconductor light emitting element disposed within the package; and
    a sealing member that covers the semiconductor light emitting element,
    a flange connected to an outer edge of the sealing member, the flange having a thickness with the sealing member having a greater thickness than the thickness of the flange,
    wherein part of the conductive wires is formed extending in the outer edge direction of the sealing member from directly beneath the semiconductor light emitting element, on the upper face of the first insulating layer, and is connected to the inner-layer wire via a conductive wire disposed in the thickness direction of the package, and
    the inner-layer wire is disposed so as to be spaced apart from an outer periphery of the semiconductor light emitting element as viewed in a cross-section of the package, the inner-layer wire being disposed on the outside of the outer edge of the sealing member below the flange as viewed in the cross-section of the package.

2. The semiconductor light emitting device according to claim 1, wherein a mark is formed on the upper face of the first insulating layer, and the mark is disposed so as to be spaced apart from the outer periphery of the semiconductor light emitting element.

3. The semiconductor light emitting device according to claim 1, wherein the package comprises a thermally conductive member or a thermal conduction layer directly beneath the semiconductor light emitting element.

4. The semiconductor light emitting device according to claim 3, wherein the thermally conductive member has a shape that spreads out from under the semiconductor light emitting element toward the rear face of the package.

5. The semiconductor light emitting device according to claim 3, wherein the thermally conductive member is constituted by a first thermal conduction layer under the semiconductor light emitting element, an insulating layer under this, and a second thermal conduction layer under the insulating layer.

6. The semiconductor light emitting device according to claim 1, wherein the package has a recess that opens onto the upper face of the first insulating layer, and the recess is disposed on the outside of the outer edge of the sealing member.

7. The semiconductor light emitting device according to claim 1, wherein the first insulating layer is composed of a ceramic.

8. The semiconductor light emitting device according to claim 3, wherein the thermally conductive member or the thermal conduction layer is made from CuW or CuMo.

9. The semiconductor light emitting device according to claim 1, wherein the inner-layer wire is disposed so as to be at least 0.2 mm away from the outer periphery of the semiconductor light emitting element.

10. The semiconductor light emitting device according to claim 1, wherein a mark is formed on the upper face of the first insulating layer, and the mark is disposed so as to be spaced apart from the outer periphery of the semiconductor light emitting element.

11. The semiconductor light emitting device according to claim 2, wherein the package has a recess that opens onto the upper face of the first insulating layer, and the recess is disposed on the outside of the outer edge of the sealing member.

12. The semiconductor light emitting device according to claim 1, wherein
the semiconductor light emitting element has a positive electrode and a negative electrode disposed on a side of the semiconductor light emitting diode with respective ones of the conductive wires extending therefrom.

13. The semiconductor light emitting device according to claim 1, wherein the sealing member has a semi-circular outer surface.

14. The semiconductor light emitting device according to claim 1, wherein the sealing member has a substantially hemispherical shape with said greater thickness being measured along a central portion of sealing member.

15. The semiconductor light emitting device according to claim 1, wherein the semiconductor light emitting element is positioned at the central portion of the package.

16. The semiconductor light emitting device according to claim 1, wherein the sealing member has a thick portion above the semiconductor light emitting element and thin portion around an area corresponding to the outer periphery of the semiconductor light emitting element.

17. The semiconductor light emitting device according to claim 1, wherein the sealing member defines a convex lens shape.

18. The semiconductor light emitting device according to claim 17, wherein the flange is located at the outer periphery of the semiconductor light emitting element.

19. The semiconductor light emitting device according to claim 17, wherein the inner-layer wire is located at the outer periphery of the semiconductor light emitting element as viewed in cross-section.

20. The semiconductor light emitting device according to claim 1, further comprising a protective element installed in the semiconductor light emitting device.

21. The semiconductor light emitting device according to claim 1, wherein the package has a recess open to the upper face of the first insulating layer, with a protective element is installed within the recess.

22. The semiconductor light emitting device according to claim 1, further comprising a protective element located at the outer periphery of the semiconductor light emitting element.

23. The semiconductor light emitting device according to claim 3, wherein the thermally conductive member is disposed in the interior of the package.

* * * * *